US006235573B1

(12) United States Patent
Lee et al.

(10) Patent No.: US 6,235,573 B1

(45) Date of Patent: May 22, 2001

(54) METHODS OF FORMING FERROELECTRIC RANDOM ACCESS MEMORY DEVICES HAVING SHARED CAPACITOR ELECTRODES

(75) Inventors: Jin-woo Lee; Yoo-sang Hwang, both of Kyungki-do; Mi-hyang Lee, Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/167,277

(22) Filed: Oct. 6, 1998

(30) Foreign Application Priority Data

Oct. 7, 1997 (KR) .................................................. 97-51449

(51) Int. Cl.[7] .................................................. H01L 21/8242

(52) U.S. Cl. .......................... 438/241; 438/240; 257/300; 257/310; 257/311

(58) Field of Search .................................... 257/300, 306, 257/308, 310, 311; 438/239, 240, 241, 250, 251, 253, 393, 394, 396, 3

(56) References Cited

U.S. PATENT DOCUMENTS 3,843,876 * 10/1974 Fette et al. .......................... 235/175
5,373,463 12/1994 Jones, Jr. ............................ 365/145
5,400,275 3/1995 Abe et al. ............................ 365/145
5,453,347 * 9/1995 Bullington et al. .................. 430/315
5,487,029 1/1996 Kuroda ................................ 365/145
5,600,587 2/1997 Koike .................................. 365/145
5,615,144 3/1997 Kimura et al. ....................... 365/145
5,615,145 3/1997 Takeuchi et al. .................... 365/145
5,789,775 * 8/1998 Evans, Jr. et al. .................. 257/295
5,869,859 * 2/1999 Hanagasaki .......................... 257/296

* cited by examiner

*Primary Examiner*—Stephen D. Meier
*Assistant Examiner*—Jeff Vockrodt
(74) *Attorney, Agent, or Firm*—Myers Bigel Sibley & Sajovec

(57) ABSTRACT

Methods of forming FRAM devices include the steps of forming first and second field effect access transistors in a semiconductor substrate, forming first and second bit lines (BL) electrically coupled to a drain region of the first field effect access transistor and a drain region of the second field effect access transistor, respectively, and forming first and second ferroelectric capacitors ($C_F$) between the first and second bit lines in order to improve integration density. These first and second ferroelectric capacitors share a first electrode extending between the first and second bit lines and have respective second electrodes electrically coupled to respective source regions of the first and second field effect access transistors. The preferred methods may also include the step of forming a field oxide isolation region adjacent a face of the substrate and extending between the first and second field effect access transistors. In addition, a step may be provided to form a first interlayer dielectric layer on the first and second field effect access transistors and on the field oxide isolation region. The step of forming the first and second ferroelectric capacitors may also comprise the preferred steps of forming a first conductive layer on the first interlayer dielectric layer, forming a ferroelectric dielectric layer (e.g., PZT, PLZT) on the first conductive layer, forming a second conductive layer on the ferroelectric dielectric layer, patterning the second conductive layer and the ferroelectric dielectric layer using a first mask to define the second electrodes of the first and second ferroelectric capacitors and then patterning the first conductive layer using a second mask to define the first electrode which is shared by the first and second ferroelectric capacitors.

8 Claims, 6 Drawing Sheets

67
65
63
61
59
57b 55 57a 53 57a 55 57b 51

67a 65a 67a 65a 63a 61a 59
57b 55 57a 53 57a 55 57b 51

67a 73 75 78 73 67a 69 65a 65a 69
79 77 71 59 79 77 71 59
57b 55 57a 61a 53 63a 57a 55 57b 51

METHODS OF FORMING FERROELECTRIC RANDOM ACCESS MEMORY DEVICES HAVING SHARED CAPACITOR ELECTRODES

FIELD OF THE INVENTION

The present invention relates to integrated circuit device fabrication methods, and more particularly to methods of fabricating integrated circuit memory devices and memory devices formed thereby.

BACKGROUND OF THE INVENTION

Ferroelectric random access memory (FRAM) devices are "nonvolatile" memory devices because they preserve data stored therein even in the absence of a power supply signal. The nonvolatile nature of a ferroelectric memory cell is a direct consequence of using a ferroelectric material as the dielectric of the cell's capacitor. Typical ferroelectric materials which can be used for the ferroelectric capacitor include Phase III potassium nitrate, bismuth titanate and lead zirconate titanate $Pb(Zr, Ti)O_3$ (PZT). Because these ferroelectric materials possess hysteresis characteristics, the polarity (i.e., state) of the ferroelectric material can be maintained even after interruption of the power supply. Thus, data (e.g., logic 0,1) can be stored in the FRAM as the polarity state of the ferroelectric material in each capacitor.

FRAM devices may typically be classified into two categories. In the first category, the gate insulating film of a field effect transistor comprises a ferroelectric material. In the second category, a field effect access transistor and a ferroelectric capacitor are provided as part of a unit cell. Unfortunately, the electrical characteristics of FRAM devices from the first category may suffer if the lattice constants or thermal expansion coefficients between a silicon substrate and the ferroelectric gate insulating film are significantly different. However, FRAM devices in the second category typically do not suffer from such limitations on performance.

Referring now to FIG. 1, a typical FRAM device from the second category includes a field effect access transistor having a gate G, source S and drain D which are electrically coupled to a word line W/L, second electrode of a ferroelectric capacitor $C_F$ and a bit line B/L, respectively. A plate line P/L is also electrically connected to a first electrode of the ferroelectric capacitor $C_F$. As illustrated by FIG. 2, the conventional FRAM device of FIG. 1 includes a source region 9 and a drain region 11 which are formed in a semiconductor substrate 1 of first conductivity type (e.g., P-type). A field oxide isolation region 3 is also provided in the substrate 1. The access transistor also includes a gate oxide layer 5 and a gate electrode 7 which is electrically coupled in common to other gate electrodes as a word line W/L. First and second borophosphosilicate glass (BPSG) layers 13 and 19 are also provided. A bit line 23 is also provided. The bit line 23 extends through the first and second BPSG layers, as illustrated. An upper electrode 21 of the ferroelectric capacitor is electrically connected to the source region 9. The lower electrode 15 and ferroelectric dielectric layer IS of the ferroelectric capacitor are provided on the first BPSG layer 13. The lower electrode and upper electrode of the ferroelectric capacitor may comprise platinum and the ferroelectric dielectric layer may comprise PZT.

Notwithstanding the above-described nonvolatile integrated circuit memory devices, there continues to be a need for more highly integrated nonvolatile memory devices (e.g., FRAM devices) and methods of forming these memory devices using simplified and economical fabrication techniques.

SUMMARY OF THE INVENTION

It is therefore an object of the present invention to provide improved methods of forming nonvolatile integrated circuit memory devices.

It is another object of the present invention to provide improved methods of forming ferroelectric random access memory (FRAM) devices.

It is still another object of the present invention to provide methods of forming highly integrated ferroelectric random access memory (FRAM) devices having preferred electrical characteristics.

These and other objects, advantages and features of the present invention are provided by methods of forming ferroelectric random access memory devices which comprise the steps of forming first and second field effect access transistors in a semiconductor substrate, forming first and second bit lines (BL) which are electrically coupled to a drain region of the first field effect access transistor and a drain region of the second field effect access transistor, respectively, and forming first and second ferroelectric capacitors ($C_F$) which extend between the first and second bit lines in order to improve integration density. These first and second ferroelectric capacitors also share a first electrode (extending between the first and second bit lines) and have respective second electrodes electrically coupled to respective source regions of the first and second field effect access transistors.

The preferred methods may also include the step of forming a field oxide isolation region adjacent a face of the substrate and extending between the first and second field effect access transistors. This field oxide isolation region may define an inactive portion of the substrate. In addition, a step may be provided to form a first interlayer dielectric layer on the first and second field effect access transistors and on the field oxide isolation region. The step of forming the first and second ferroelectric capacitors may also comprise the preferred steps of forming a first conductive layer on the first interlayer dielectric layer, forming a ferroelectric dielectric layer (e.g., PZT, PLZT) on the first conductive layer, forming a second conductive layer on the ferroelectric dielectric layer, patterning the second conductive layer and the ferroelectric dielectric layer (using a first mask) to define the second electrodes of the first and second ferroelectric capacitors and then patterning the first conductive layer (using a second mask) to define the first electrode which is shared by the first and second ferroelectric capacitors. The step of forming a first conductive layer is preferably preceded by the step of forming a barrier layer comprising titanium dioxide on the first interlayer dielectric layer. This barrier layer is designed to improve the degree of adhesion between the first conductive layer and the field oxide isolation region. The first and second conductive layers may also comprise a material selected from the group consisting of Pt, $ReO_2$, $RuO_2$ and $MoO_3$ and combinations thereof.

The step of patterning the first conductive layer may then be followed by the step of encapsulating the second electrodes with a titanium dioxide ($TiO_2$) capping layer. The preferred methods may also comprise the steps of forming a second interlayer dielectric layer on the capping layer and on the first interlayer dielectric layer and then patterning the first and second interlayer dielectric layers and capping layer to expose the source and drain regions of the first and second field effect access transistors and expose the second electrodes of the first and second ferroelectric capacitors.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. In addition, the terms "first conductivity type" and "second conductivity type" refer to opposite conductivity types and each embodiment disclosed herein includes its complementary embodiment. Like numbers refer to like elements throughout.

Figure 1:
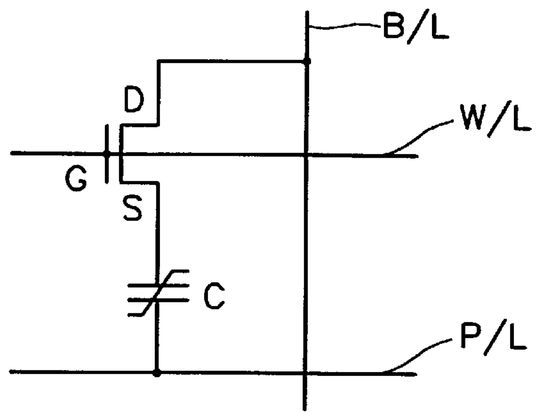
FIG. 1 is an electrical schematic of a ferroelectric random access memory (FRAM) device unit cell according to the prior art.
Figure 2:
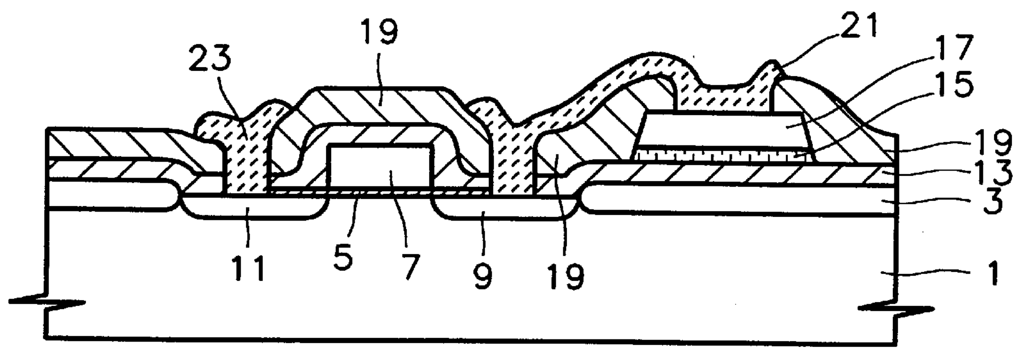
FIG. 2 is a cross-sectional view of an FRAM device unit cell according to the prior art.
Figure 3:
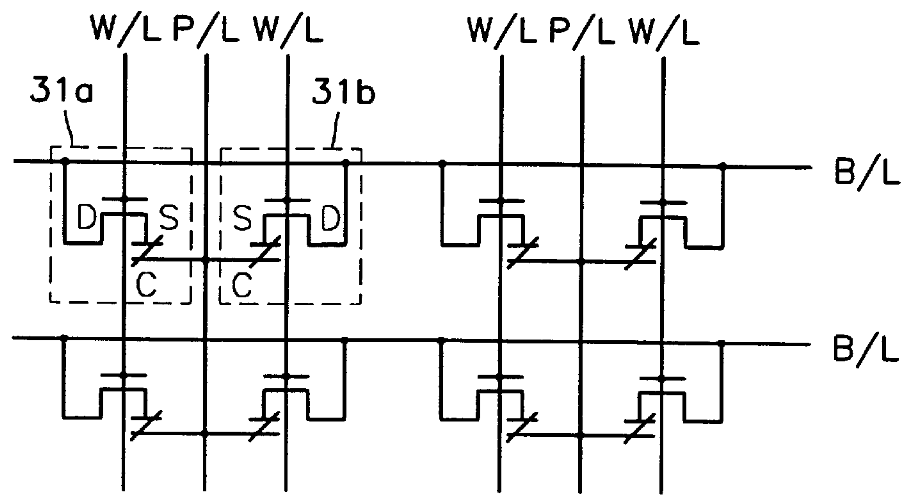
FIG. 3 is an electrical schematic of an integrated circuit FRAM device according to an embodiment of the present invention.

Referring now to FIG. 3, a ferroelectric random access memory (FRAM) device according to an embodiment of the present invention includes an array of FRAM device unit cells arranged as a plurality of pairs of cells in a two-dimensional array. For example, a first pair of FRAM cells 31*a* and 31*b* are arranged side-by-side and are separated by a respective plate line P/L running therebetween. The gate electrode of an access transistor in each FRAM device unit cell is electrically connected to a respective word line W/L. The drain region of each FRAM device unit cell is electrically connected to a respective bit line B/L and the source region of each FRAM device unit cell is electrically connected to a second electrode of a respective ferroelectric capacitor $C_F$. According to a preferred aspect of the present invention, the first electrodes of adjacent ferroelectric capacitors $C_F$ are contiguous and are connected to a corresponding plate line P/L, as illustrated.

Figure 4:
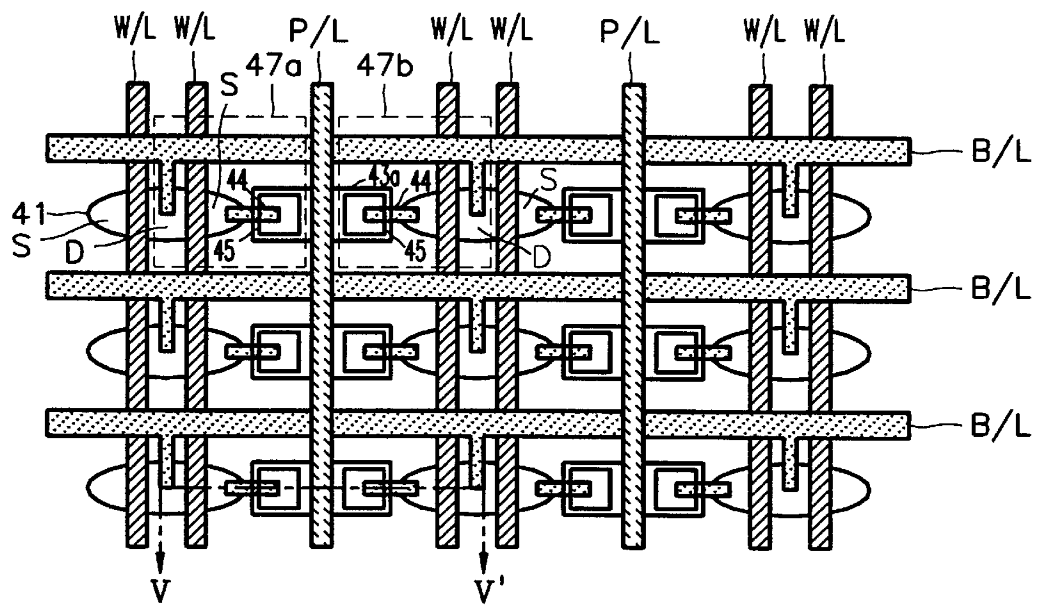
FIG. 4 is a plan layout view of the FRAM device of FIG. 3.

Referring now to FIG. 4, a plan layout view of the FRAM device of FIG. 3 is provided. Here, the active region for each access transistor is illustrated by reference numeral 41. This active region 41 includes a source region S and a drain region D. Reference numerals 47*a* and 47*b* denote adjacent FRAM unit cells. In addition, reference numeral 45 denotes a second (e.g., upper) electrode of a ferroelectric capacitor of a respective unit cell, reference numeral 43*a* denotes the shared first (e.g., lower) electrode of a pair of adjacent unit cells and reference numeral 44 denotes a wiring layer which electrically connects the second electrode of a ferroelectric capacitor to a respective source region S within a unit cell.

Figure 5:
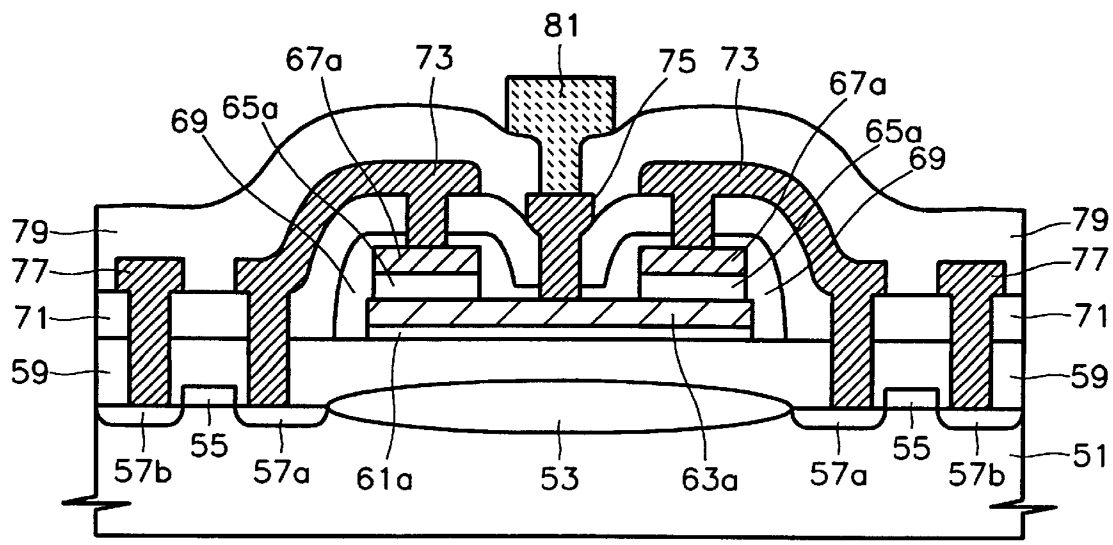
FIG. 5 is a cross-sectional view of a pair of adjacent FRAM device unit cells, taken along the line V–V' of FIG. 4.

Referring now to FIG. 5, a cross-sectional view of a pair of adjacent FRAM device unit cells, taken along the line V–V' of FIG. 4, is provided. In particular, first and second field effect access transistors are provided in a semiconductor substrate 51 of first conductivity type (e.g., P-type). Each of the field effect access transistor includes a source region 57*a*, an insulated gate electrode 55 and a drain region 57*b*. A field oxide isolation region 53 is also provided between adjacent access transistors. A first interlayer dielectric layer 59, a second interlayer dielectric layer 71 and a third interlayer dielectric layer 79 are also provided. These interlayer dielectric layers may comprise borophosphosilicate glass (BPSG) layers formed by chemical vapor deposition (CVD) for example.

Referring still to FIG. 5, a titanium dioxide ($TiO_2$) barrier layer 61*a* is provided on the first interlayer dielectric layer 59 and a first electrode 63*a* of a pair of ferroelectric capacitors is provided on the thin barrier layer 61*a*. This thin barrier layer 61*a* improves the degree of adhesion between the first electrode 63*a* and the first interlayer dielectric layer 59. The ferroelectric dielectric regions 65*a* are also provided at spaced locations on the first electrode 63*a*. The second electrodes 67*a* of each pair of adjacent ferroelectric capacitors are also provided on respective ferroelectric dielectric regions 65*a*. Each pair of ferroelectric capacitors is also preferably encapsulated by an electrically insulating capping layer 69 comprising titanium dioxide ($TiO_2$). The first and second electrodes may also comprise a material selected from the group consisting of Pt, $ReO_2$, $RuO_2$ and $MoO_3$ and combinations thereof.

As illustrated by FIG. 5, contact holes are formed which extend through the first and second interlayer dielectric layers 59 and 71 to expose the source and drain regions 57*a*, 57*b* of the access transistors, and also extend through the second interlayer dielectric layer 71 and the capping layer 69 to expose the second electrodes 67*a* of adjacent ferroelectric capacitors. A layer of metallization may also be patterned as a plurality of bit lines 77, a plurality of wiring layers 73, and an intermediate plate line contact 75. The third interlayer dielectric layer 79 may also be conformally deposited and a contact hole may be defined therein to expose the intermediate plate line contact 75. A metal plate line 81 may also be formed in the contact hole using conventional techniques.

Figure 6:
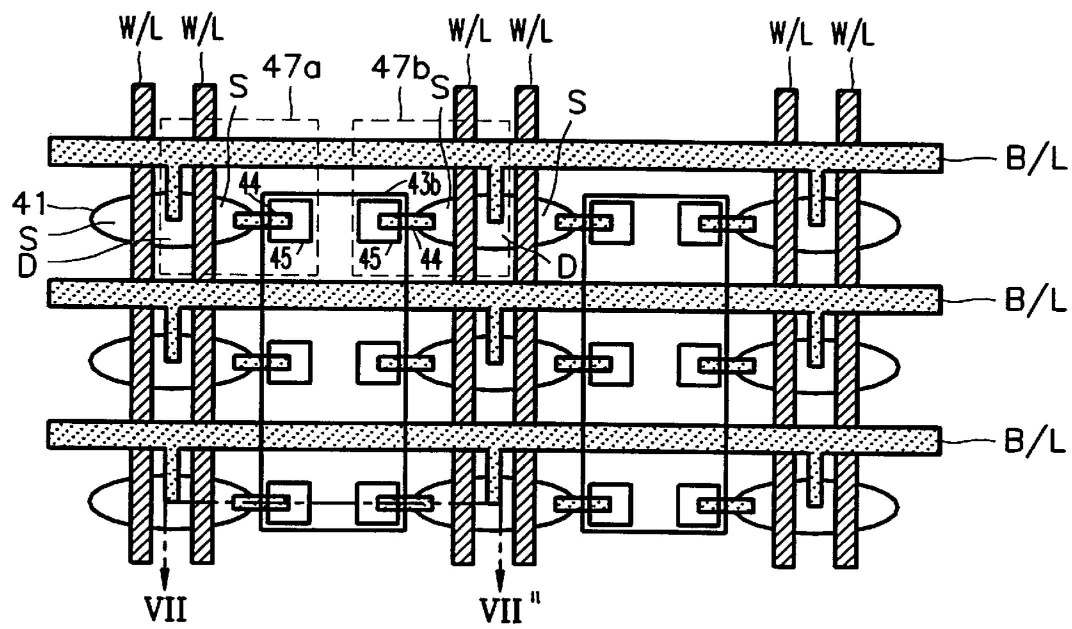
FIG. 6 is a plan layout view of an alternative FRAM device of FIG. 3.
Figure 7:
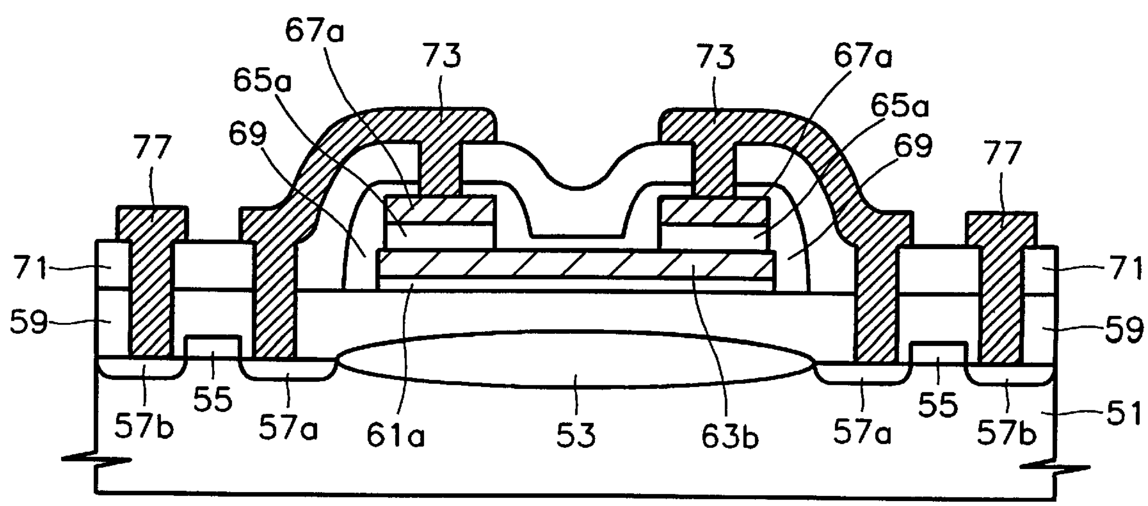
FIG. 7 is a cross-sectional view of a pair of adjacent FRAM device unit cells, taken along the line VII–VII' of FIG. 6.

The FRAM device of FIGS. 6–7 is similar to the FRAM device of FIGS. 4–5, however, to further improve integration density and further reduce the complexity and cost of device fabrication, the first electrode of each ferroelectric capacitor is shared by a relatively wide common first electrode 43*b* which also acts as a plate line and, as illustrated best by FIG. 6, this common first electrode 43*b* extends between adjacent columns of FRAM unit cells and adjacent rows of FRAM unit cells.

Figure 8:
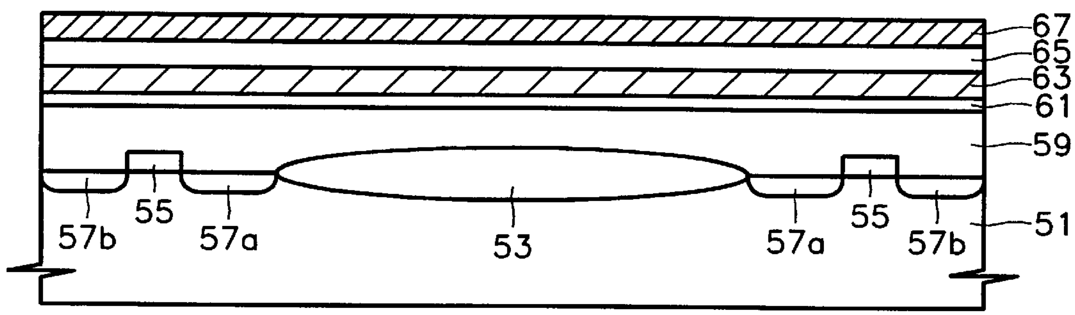
FIGS. 8–13 are cross-sectional views of intermediate structures which illustrate a first embodiment of a preferred method of forming the FRAM device of FIG. 4.

Referring now to FIGS. 8–14, preferred methods of forming ferroelectric random access memory devices will be described. In particular, FIG. 8 illustrates the steps of forming first and second field effect access transistors in a semiconductor substrate 51 of first conductivity type (e.g., P-type), using conventional MOS fabrication techniques. These access transistors are spaced from each other by a field oxide isolation region 53 which may be formed using a conventional local oxidation of silicon (LOCOS) technique or a shallow-trench isolation (STI) technique. Each of these first and second field effect access transistors may comprise an insulated gate electrode 55 (which may be patterned as a stripe-shaped word line W/L extending between adjacent rows of FRAM device unit cells), a source region 57*a* and a drain region 57*b*, as illustrated.

A first interlayer dielectric layer 59 may then be formed by depositing borophosphosilicate glass (BPSG) on the field oxide isolation region 53 and access transistors using chemical vapor deposition (CVD) and then reflowing the deposited glass to form a uniform electrically insulating layer. Next, a barrier film layer 61, a first electrically conductive layer 63, a ferroelectric dielectric layer 65 and a second electrically conductive layer 67 are deposited in sequence on the first interlayer dielectric layer 59. The barrier film layer 61 may comprise titanium dioxide ($TiO_2$) and act to increase the degree of adhesion between the first interlayer dielectric layer 59 and the first conductive layer 63 (which is subsequently patterned as a lower electrode of a ferroelectric capacitor). The first and second conductive layers 63 and 67 may also be formed of a metal or metal oxide. The preferred conductive layers comprise a material selected from the group consisting of Pt, $ReO_2$, $RuO_2$ and $MoO_3$ and combinations thereof. To improve the electrical characteristics of the resulting ferroelectric capacitors, each of the first and second conductive layers are preferably formed as a composite of a metal layer, a metal-oxide layer and another metal layer to form a metal-oxide-metal (MOM) composite structure. Thus, any thermal expansion of the metal layers during subsequent thermal treatment steps can be compensated for by the compression stress generated in the metal-oxide layer in response to oxygen volatility. Thus, the ferroelectric dielectric layer 65 can function relatively free of external stress and the resulting reliability and electrical characteristics of the ferroelectric capacitors formed therefrom can be improved. The ferroelectric dielectric layer 65 also preferably comprises a layer of PZT ($PbZr_xTi_{1-x}O_3$) or a layer of PLZT which can be obtained by doping a layer of PZT with La deposited using a sol-gel method, a sputtering method or a CVD method.

Figure 9:
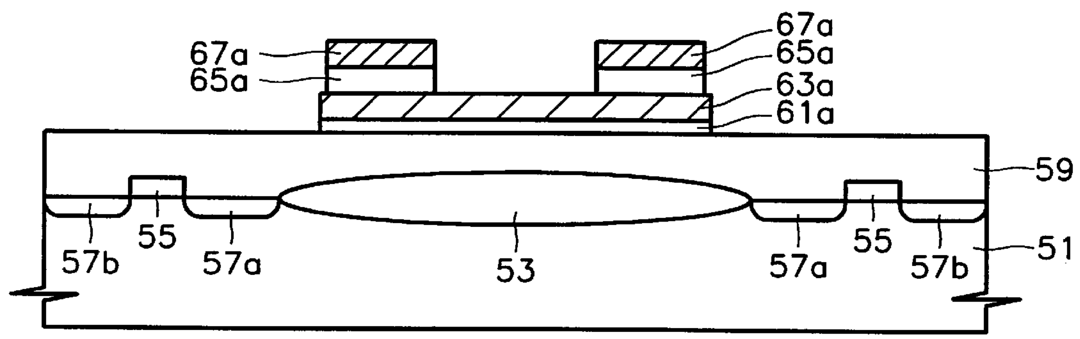
Figure 10:
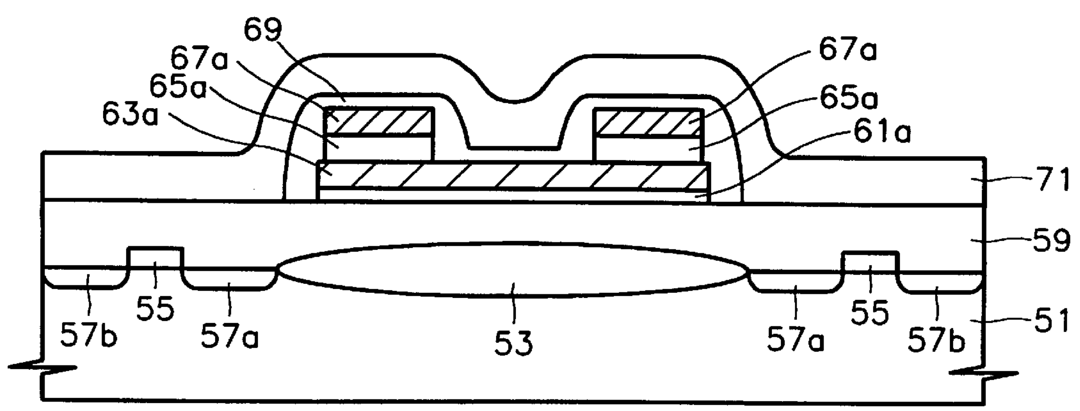

Referring now to FIG. 9, a step is then performed to photolithographically pattern the second conductive layer 67 and the ferroelectric dielectric layer 65 using a first mask, to define the second electrodes 67*a* and the dielectric regions 65*a* of the first and second ferroelectric capacitors. Another photolithographically defined etching step is then performed to pattern the first conductive layer 63 and the barrier layer 61, to define the first electrode 63*a* which is shared by adjacent ferroelectric capacitors $C_F$ and define a barrier layer pattern 61*a*. Next, as illustrated by FIG. 10, an electrically insulating layer is deposited on the structure of FIG. 9 and patterned to define a capping layer 69 which encapsulates the adjacent ferroelectric capacitors. This capping layer 69 preferably comprises titanium dioxide. After formation of the capping layer 69, a second interlayer dielectric layer 71 is deposited. This second interlayer dielectric layer 71 may be formed by depositing a borophosphosilicate glass (BPSG) layer on the first interlayer dielectric layer 59 and on the capping layer 69, using a chemical vapor deposition (CVD) method and then reflowing the deposited glass to form a uniform electrically insulating layer.

Figure 11:
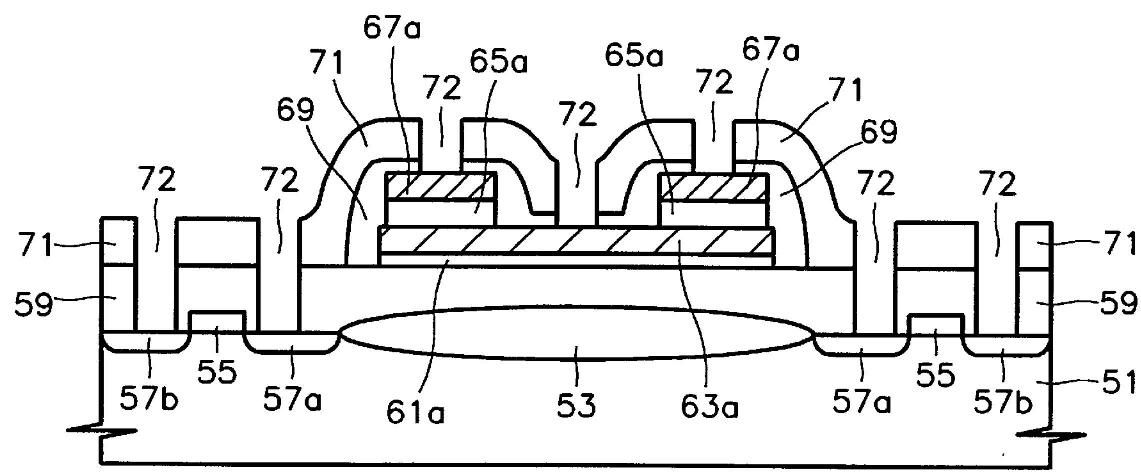
Figure 12:
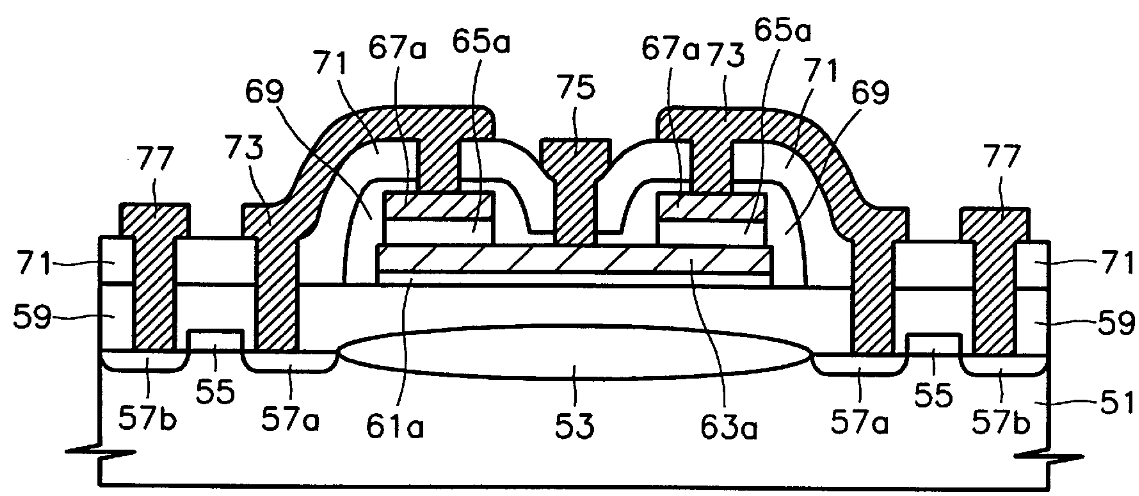
Figure 13:
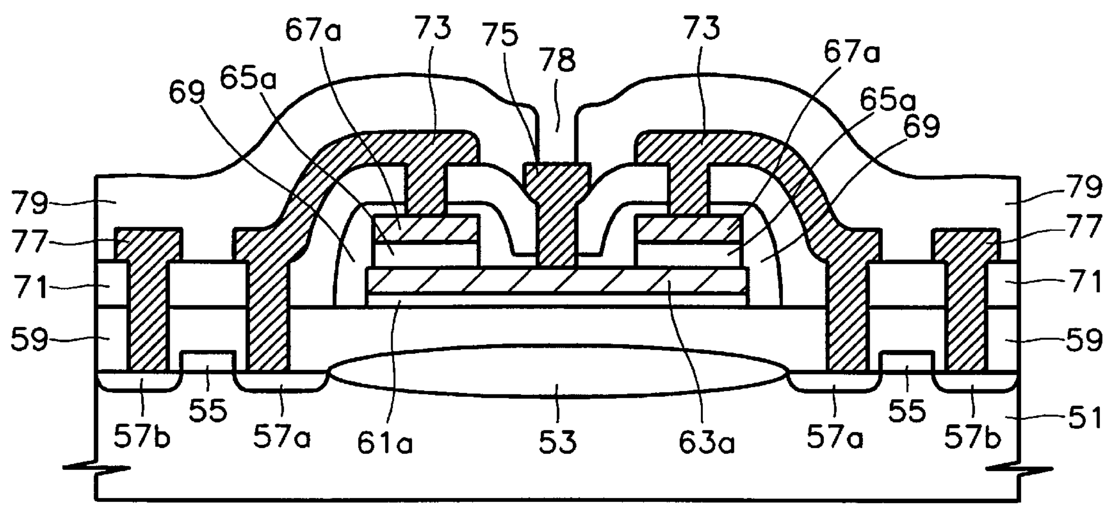

Referring now to FIG. 11, steps are then performed to pattern the first and second interlayer dielectric layers 59 and 71 to define contact holes 72 therein. These contact holes 72 expose the source and drain regions 57*a*, 57*b* of the first and second field effect access transistors, expose the second electrodes 67*a* of the first and second ferroelectric capacitors $C_F$ and expose the shared first electrode 63*a*. Then, as illustrated by FIG. 12, a layer of metallization is deposited and patterned to define a plurality of bit lines 77, a plurality of wiring layers 73 and an intermediate plate line contact 75. Next, as illustrated best by FIG. 13, a third interlayer dielectric layer 79 may be formed by depositing a borophosphosilicate glass (BPSG) layer on the structure of FIG. 12, using a chemical vapor deposition (CVD) method and then reflowing the deposited glass to form a uniform electrically insulating layer. This third interlayer dielectric layer 79 is then patterned to define a contact hole 78 therein which exposes the intermediate plate line contact 75. Then, as illustrated by FIG. 5, steps are performed to form a metal plate line 81 in the contact hole using conventional techniques.

Figure 14:
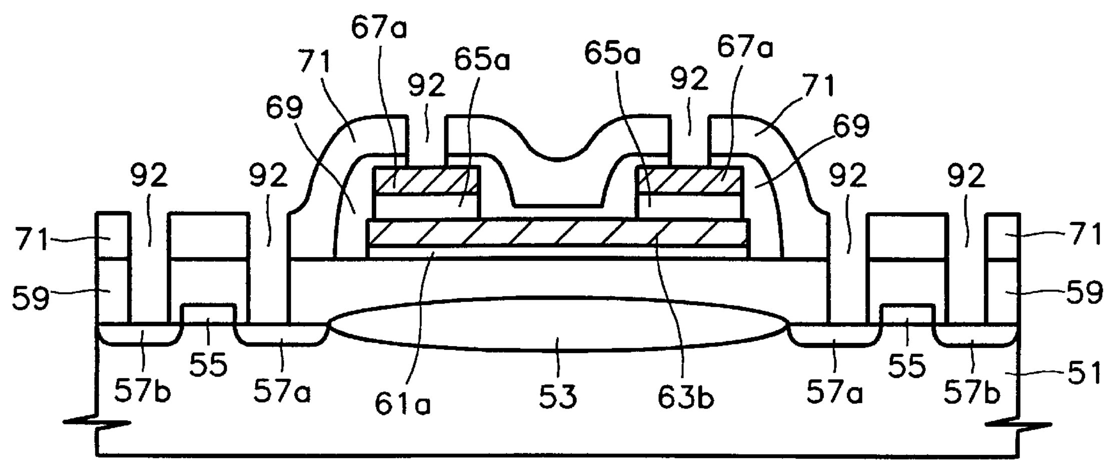
FIG. 14 is a cross-sectional view of an intermediate structure which when combined with the cross-sectional views of FIGS. 8–10, illustrates a second embodiment of a preferred method of forming the FRAM device of FIG. 6.

Referring now to FIG. 14, a cross-sectional view of an alternative intermediate structure is provided. This structure of FIG. 14, when combined with the cross-sectional views of FIGS. 8–10, illustrates a second embodiment of a preferred method of forming the highly integrated FRAM device of FIG. 6. In particular, FIG. 14 illustrates the steps of patterning the first and second interlayer dielectric layers 59 and 71 of FIG. 10 to define contact holes 92 therein. These contact holes 92 expose the source and drain regions 57*a*, 57*b* of the first and second field effect access transistors and expose the second electrodes 67*a* of the first and second ferroelectric capacitors $C_F$, but do not expose the shared first electrode 63*b* (corresponding to layout pattern 43*b* of FIG. 6) which acts as a plate line P/L. Accordingly, based on this second embodiment, it is unnecessary to perform separate steps to define an intermediate plate line contact 75 or metal plate line 81.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a ferroelectric random access memory device, comprising the steps of:

forming first and second field effect access transistors and a field oxide isolation region extending between the first and second field effect access transistors, adjacent a face of a semiconductor substrate;

forming a first bit line that extends in a first direction across the semiconductor substrate, is electrically coupled to a drain region of the first field effect access transistor by a first bit line extension that extends in a second direction orthogonal to the first direction and is electrically coupled to a drain region of the second field effect access transistor by a second bit line extension that extends in the second direction; and forming first and second ferroelectric capacitors which share a first electrode extending between the first and second bit line extensions and have respective second electrodes electrically coupled to respective source regions of the first and second field effect access transistors.

2. A method of forming a ferroelectric random access memory device, comprising the steps of:

forming first and second field effect access transistors in a semiconductor substrate;

forming a field oxide isolation region adjacent a face of the substrate and extending between the first and second field effect transistors;

forming a first interlayer dielectric layer on the first and second field effect access transistors and on the field oxide isolation region;

forming a first bit line that is electrically coupled to a drain region of the first field effect access transistor and a drain region of the second field effect access transistor; and forming first and second ferroelectric capacitors which share a first electrode and have respective second electrodes electrically coupled to respective source regions of the first and second field effect access transistors, by forming a first conductive layer on the first interlayer dielectric layer;

forming a ferroelectric dielectric layer on the first conductive layer;

forming a second conductive layer on the ferroelectric dielectric layer;

patterning the second conductive layer and the ferroelectric dielectric layer using a first mask, to define the second electrodes of the first and second ferroelectric capacitors; and patterning the first conductive layer using a second mask, to define the first electrode.

3. The method claim 2, wherein said step of patterning the first conductive layer is followed by the step of encapsulating the second electrodes of the first and second ferroelectric capacitors with a titanium dioxide capping layer.

4. The method claim 2, further comprising the steps of forming a second interlayer dielectric layer on the second electrodes of the first and second ferroelectric capacitors and on the first interlayer dielectric layer; and patterning the first and second interlayer dielectric layers to expose the source and drain regions of the first and second field effect access transistors and expose the second electrodes of the first and second ferroelectric capacitors.

5. The method claim 3, further comprising the steps of forming a second interlayer dielectric layer on the second electrodes of the first and second ferroelectric capacitors and on the first interlayer dielectric layer; and patterning the first and second interlayer dielectric layers and the capping layer to expose the source and drain regions of the first and second field effect access transistors and expose the second electrodes of the first and second ferroelectric capacitors.

6. The method claim 2, wherein said step of forming a first conductive layer is preceded by the step of forming a barrier layer comprising titanium dioxide on the first interlayer dielectric layer; and wherein said step of forming a first conductive layer comprises forming a first conductive layer on the barrier layer.

7. The method claim 6, wherein the first and second conductive layers comprise a material selected from the group consisting of Pt, $ReO_2$, $RuO_2$ and $MoO_3$ and combinations thereof.

8. The method claim 4, wherein said step of forming a first bit line follows said step of patterning the first and second interlayer dielectric layers.

* * * * *